(12) United States Patent
Fujiwara et al.

(10) Patent No.: US 8,040,214 B2
(45) Date of Patent: Oct. 18, 2011

(54) SEMICONDUCTOR DEVICE AND MANUFACTURING METHOD OF THE SAME

(75) Inventors: Tsuyoshi Fujiwara, Hamura (JP); Toshinori Imai, Ome (JP); Kenichi Takeda, Tokorozawa (JP); Hiromi Shimamoto, Iruma (JP)

(73) Assignee: Hitachi, Ltd., Tokyo (JP)

( * ) Notice: Subject to any disclaimer, the term of this patent is extended or adjusted under 35 U.S.C. 154(b) by 308 days.

(21) Appl. No.: 12/481,384

(22) Filed: Jun. 9, 2009

(65) Prior Publication Data

US 2009/0302993 A1 Dec. 10, 2009

(30) Foreign Application Priority Data

Jun. 10, 2008 (JP) ................................. 2008-151225

(51) Int. Cl.
*H01C 1/12* (2006.01)

(52) U.S. Cl. ...................................... 338/314; 338/22 R

(58) Field of Classification Search ................ 338/22 R, 338/314
See application file for complete search history.

(56) References Cited

U.S. PATENT DOCUMENTS 7,582,901 B2 * 9/2009 Takeda et al. .................... 257/68
2007/0151968 A1 * 7/2007 Yamashita et al. ............. 219/553
2009/0015369 A1 * 1/2009 Takeda et al. .................. 338/307
2009/0302993 A1 * 12/2009 Fujiwara et al. ............... 338/314

FOREIGN PATENT DOCUMENTS

| JP | 05-275619 A | 10/1993 |
|----|-------------|---------|
| JP | 2004-014769 A | 1/2004 |

* cited by examiner

*Primary Examiner* — James Harvey
(74) *Attorney, Agent, or Firm* — Miles & Stockbridge P.C.

(57) ABSTRACT

A semiconductor device according to the present invention includes: a lower-surface oxidation preventing insulating film formed on a lower surface of a metal resistor element; an upper-surface oxidation preventing insulating film formed on an upper surface of the metal resistor element; and a side-surface oxidation preventing insulating film formed only near a side surface of the metal resistor element by performing anisotropic etching after being deposited on a whole surface of a wafer in a process separated from the lower-surface oxidation preventing insulating film and the upper-surface oxidation preventing insulating film. According to the present invention, it is possible to prevent the increase of the resistance value due to the oxidation of the metal resistor element and also to prevent the increase of the parasitic capacitance between metal wiring layers without complicating the fabrication process.

10 Claims, 17 Drawing Sheets

SEMICONDUCTOR DEVICE AND MANUFACTURING METHOD OF THE SAME

CROSS-REFERENCE TO RELATED APPLICATION

The present application claims priority from Japanese Patent Application No. JP 2008-151225 filed on Jun. 10, 2008, the content of which is hereby incorporated by reference into this application.

FIELD OF THE INVENTION

The present invention relates to a semiconductor device in which a high-precision and high-performance resistor element is mounted and a manufacturing method of the semiconductor device.

BACKGROUND OF THE INVENTION

As for an RF analog LSI, to configure a circuit including high-performance capacitor element, resistor element and inductor element is an important factor. Particularly, the polysilicon resistor element has been conventionally used for the resistor element in a LSI, but the resistance value is fluctuated by the temperature increase due to the heat applied in the package mounting process and the self-heating caused by current flow, which poses a problem in configuring a high-precision analog circuit.

Japanese Patent Application Laid-Open Publication No. 5-275619 (Patent Document 1) discloses a technique of performing an activation annealing of impurities in a polysilicon layer after forming a nitride film covering an upper surface and side surfaces of the polysilicon layer in order to prevent the fluctuation of a resistance value of a polysilicon resistor element due to the oxidation of the polysilicon layer in an activation annealing of impurities ion-implanted into the polysilicon layer.

Also, an important issue for the solution of the above-described problem is to incorporate a metal resistor element of a tantalum nitride (TaN) based material or the like, which has been widely used for a single resistor element, has small frequency dependence of a resistance value and a small resistance-temperature coefficient and is stable against heat generated in the mounting and use, into the miniaturized LSI process.

FIG. 2 shows a metal resistor element described in Japanese Patent Application Laid-Open Publication No. 2004-014769 (Patent Document 2). In the metal resistor element of Patent Document 2, an organic film 8 is formed on a substrate 2 and a curing at 200 to 400° C. is performed, and then, an oxidation preventing layer 15 made of an inorganic material is formed. By this means, the diffusion of oxidative components from the organic film 8 is suppressed, thereby preventing the resistance fluctuation due to the oxidation of a resistive element 3 represented by TaN. Also, the resistive element 3 is integrally formed with the oxidation preventing layer 15 in vacuum. Further, the structure of the resistive element 3 itself is made to have a two-layer structure of a substrate-side low resistance layer 3b and a surface-side high resistance layer 3a, so that the influence of oxidation on the surface side is confined within the surface-side high resistance layer 3a, thereby preventing the influence due to the oxidation from the top and bottom to the substrate-side low resistance layer 3b that actually functions as the resistive element.

SUMMARY OF THE INVENTION

However, since the metal resistor element of the Patent Document 2 is a single resistor element, it has a size as large as several tens μm, and when it is incorporated as it is into the miniaturized LSI process, the area of the resistor element is increased. For the incorporation into the miniaturized LSI process, it is indispensable to miniaturize the line width of the resistor element so as to reduce the area of the resistor element. However, since the ratio of the side-surface portion occupying the cross-sectional area of the resistor is inevitably increased when the line width of the resistor element is miniaturized, the influence of the oxidation at the side-surface portion becomes unignorable.

Furthermore, in the conventional example, after forming a conductive portion 6 and an electrode 7 at a portion other than that protected by a resist 5, it is mounted in the package and then completed. In the LSI process, however, in order to form and incorporate the resistive element into the LSI chip, the process in which heat load of 400° C. or higher is applied has to be performed several times even after the formation of the resistive element, so that the resistor element is oxidized due to the diffusion of oxygen and moisture from CVD films forming a multilayer wiring insulating film, and the fluctuation of the resistance value is increased.

The results of the fluctuation of the resistance value generated when the inventors of the present invention formed and incorporated a TaN resistor element in the LSI multilayer wiring structure will be described. FIG. 3 and FIG. 4 are schematic cross-sectional views showing the structures evaluated this time. The structure in which a TaN resistor element 301 is sandwiched by SiN films 102 and 103 for the purpose of oxidation prevention is formed, and the fluctuation of the resistance value is compared between the case with an upper-layer metal wiring pattern 501a and the case without the upper-layer metal wiring pattern 501a.

FIG. 5 shows how the resistance value at the initial stage of the formation of the TaN resistor element fluctuates by the application of the heat load of 400° C. in both the structure with the upper-layer metal wiring pattern in the multilayer wiring shown in FIG. 3 and the structure without the upper-layer metal wiring pattern shown in FIG. 4. Note that the TaN resistor element is formed to have a thickness of 20 nm and a resistor width of 500 nm. In this structure, the side surface of the TaN resistor element is connected to upper and lower silicon oxide films 101 and 107 via a silicon oxide film 106 made of a plasma CVD film. In the silicon oxide films 101, 106 and 107 made of plasma CVD films, $H_2O$ desorbs from the films when the heat load of 400° C. is applied as shown by the results of the temperature-programmed desorption spectrum analysis in FIG. 6. Therefore, the sidewall portion of the TaN resistor element is oxidized and the actual resistor width is reduced, and thus, the resistance value is increased. At this time, the amount of the silicon oxide film that generates $H_2O$ as oxidation source differs depending on the presence of the upper metal wiring pattern, and as a result, the oxidation of the TaN resistor element more progresses and the resistance value is more increased in the structure shown in FIG. 4 in which the amount of surrounding silicon oxide film is large. Further, even in the metal resistor elements that have the same shape at the time of formation, the resistance values thereof become different from each other after the application of heat treatment because the fluctuation rate of the resistance differs depending on the wiring pattern layout in the upper layer. As described above, it has been revealed that, when a metal resistor element using a metal resistive element represented by TaN is fabricated in the LSI multilayer wiring structure, the problems of the dependence of the resistance value on the upper and lower wiring pattern layouts and the precision deterioration are caused by the miniaturization and the heat load.

Also, in the Patent Document 1, the side surface of the polysilicon layer is covered by a nitride film in order to prevent the fluctuation of a resistance value of the polysilicon resistor element, but this nitride film is formed and deposited on the whole surface of the wafer so as to cover not only the side surface of the polysilicon layer but also the upper surface. Therefore, when the conventional technique of the Patent Document 1 is applied to the metal resistor element in the LSI multilayer wiring structure shown in FIG. 4 and FIG. 5, the etching conditions have to be changed in the process of forming contact holes for plugs 204 after the formation of the metal resistor element, and thus the fabrication process becomes complicated. Furthermore, there arises a problem of the increase of the parasitic capacitance between the wiring layer 500 below the metal resistor element and the wiring layer 501 above the metal resistor element due to the nitride layer.

An object of the present invention is to solve the problem of the dependence of the resistance value on the upper and lower wiring pattern layout and the precision deterioration caused when a metal resistor element using a metal resistive element represented by TaN is fabricated in the LSI multilayer wiring structure and simultaneously solve the problem of the extra process for the LSI multilayer wiring structure and the increase of the parasitic capacitance.

For the achievement of the object, the semiconductor device according to the present invention comprises: a lower-surface oxidation preventing insulating film formed on a lower surface of a metal resistor element; an upper-surface oxidation preventing insulating film formed on an upper surface of the metal resistor element; and a side-surface oxidation preventing insulating film formed only near a side surface of the metal resistor element by performing anisotropic etching after being deposited on a whole surface of a wafer in a process separated from the lower-surface oxidation preventing insulating film and the upper-surface oxidation preventing insulating film.

According to the present invention, the increase of the resistance value due to the oxidation of the metal resistor element can be prevented, and at the same time, the increase of the parasitic capacitance between metal wiring layers can be prevented without complicating the fabrication process.

DETAILED DESCRIPTION OF THE PREFERRED EMBODIMENTS

Hereinafter, embodiments of the present invention will be described in detail with reference to the accompanying drawings.

First Embodiment

Figure 1:
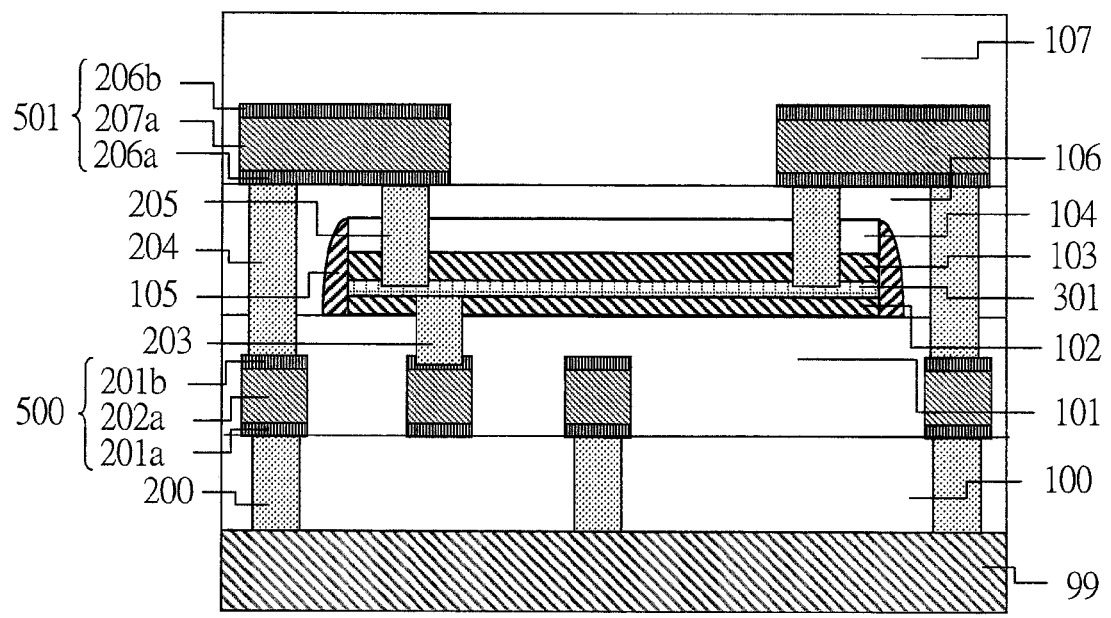
FIG. 1 is a schematic cross-sectional view of a semiconductor device according to the first embodiment of the present invention.

FIG. 1 is a schematic cross-sectional view of a semiconductor device according to the first embodiment of the present invention. Also, FIG. 7A to FIG. 7M are schematic cross-sectional views showing the manufacturing method of a semiconductor device according to the first embodiment of the present invention. The manufacturing method will be described below in due order.

Figure 7A:
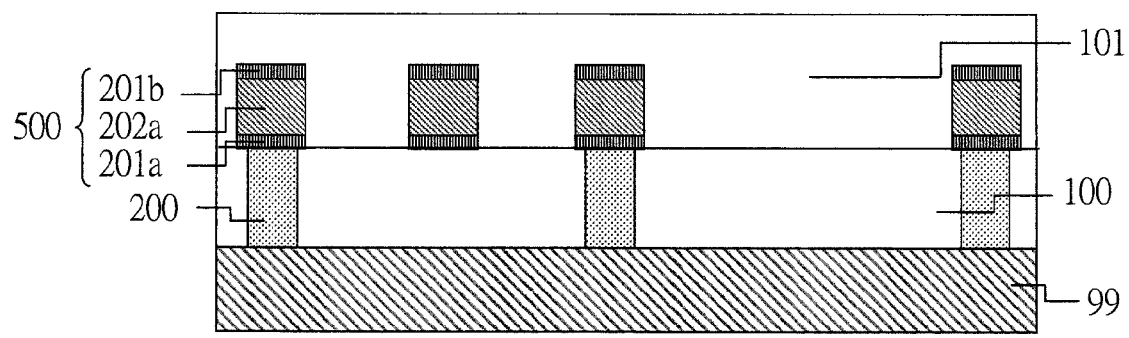
FIG. 7A is a schematic cross-sectional view showing the manufacturing process in the manufacturing method of the semiconductor device according to the first embodiment of the present invention.

FIG. 7A shows a multilayer wiring structure formed below a metal resistor element. First, after forming a first interlayer insulating film 100 of about 1000 nm made of a silicon nitride film or a silicon oxide film on a semiconductor substrate 99, first conductive contact hole plugs 200 each composed of a barrier film having a structure including a titanium film of about 30 nm and a titanium nitride film of about 100 nm deposited on the titanium film and tungsten are formed. Next, after a first aluminum alloy film 202a of about 500 nm and a first lower-layer barrier film 201a and a first upper-layer barrier film 201b each including a titanium film of about 10 to 30 nm and a titanium nitride film of about 20 to 100 nm formed as upper and lower layers of the aluminum alloy film 202a are formed by the sputtering method, first metal wiring layers 500 are formed by using the lithography method and the dry etching method. Then, a silicon oxide film is deposited thereon by the CVD method at a temperature of about 200 to 400° C., and the silicon oxide film is planarized by the chemical mechanical polishing method, thereby forming a second interlayer insulating film 101.

Figure 7B:
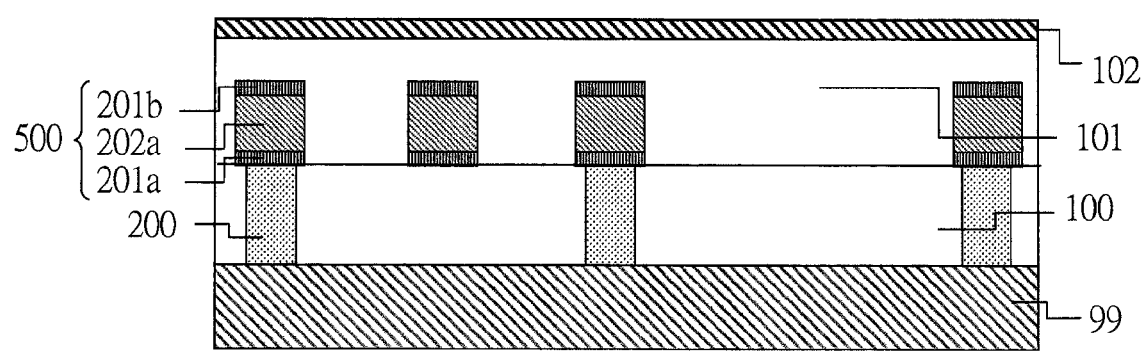
FIG. 7B is a schematic cross-sectional view showing the manufacturing process in the manufacturing method of the semiconductor device according to the first embodiment of the present invention.

FIG. 7B shows a state in which an insulating film 102 of about 50 nm made of, for example, a silicon nitride (SiN) film, a silicon carbide (SiC) film or a silicon carbon nitride (SiCN) film containing no oxygen in its formation process and the film itself is deposited as a lower-surface oxidation preventing layer of the metal resistor element by using the CVD method on the structure shown in FIG. 7A.

Figure 7C:
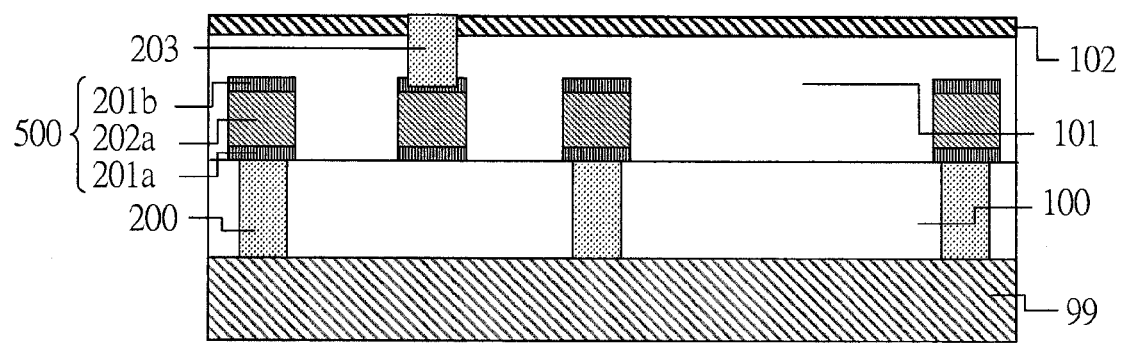
FIG. 7C is a schematic cross-sectional view showing the manufacturing process in the manufacturing method of the semiconductor device according to the first embodiment of the present invention.

FIG. 7C shows a state in which a second conductive contact hole plug 203 composed of a barrier film having a structure including a titanium film of about 10 nm and a titanium nitride film of about 50 nm deposited on the titanium film and tungsten is formed after forming a contact hole by using the lithography method and the dry etching method for the electrical connection between the first metal wiring layer 500 and the metal resistor element.

Figure 7D:
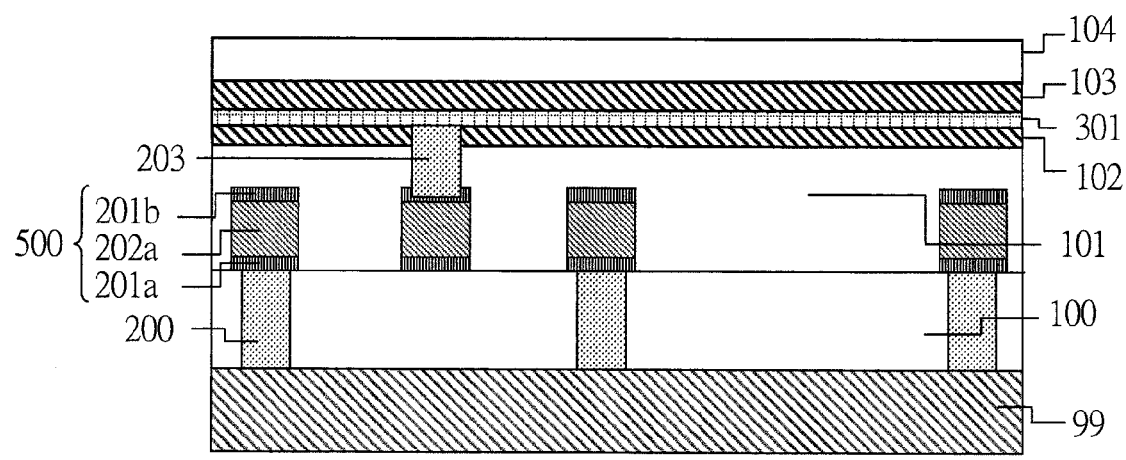
FIG. 7D is a schematic cross-sectional view showing the manufacturing process in the manufacturing method of the semiconductor device according to the first embodiment of the present invention.

Next, as shown in FIG. 7D, on a resistive element 301 to be the metal resistor element made of a metal film, a metal nitride film or a metal silicide film deposited to about 10 to 50 nm, an insulating film 103 of about 50 nm made of, for example, a silicon nitride (SiN) film, a silicon carbide (SiC) film or a silicon carbon nitride (SiCN) film containing no oxygen in its formation process and the film itself is deposited as an upper-surface oxidation preventing layer by using the CVD method. Further, an insulating film 104 made of a material different from that of the upper-surface oxidation preventing layer 103 and having an etching selectivity to the upper-surface oxidation preventing layer 103 is deposited. This insulating film 104 is one of the features of the present invention, and it is preferable to form the insulating film 104 so as to be thicker than any of the upper-surface oxidation preventing layer 103, the resistive element 301 and the lower-surface oxidation preventing layer 102. It is more preferable to form the insulating film 104 so as to have the thickness larger than the thickness of the three-layer structure of the upper-surface oxidation preventing layer 103, the resistive element 301 and the lower-surface oxidation preventing layer 102. In this embodiment, a silicon oxide film is deposited to about 100 to 200 nm as the insulating film 104.

Figure 7E:
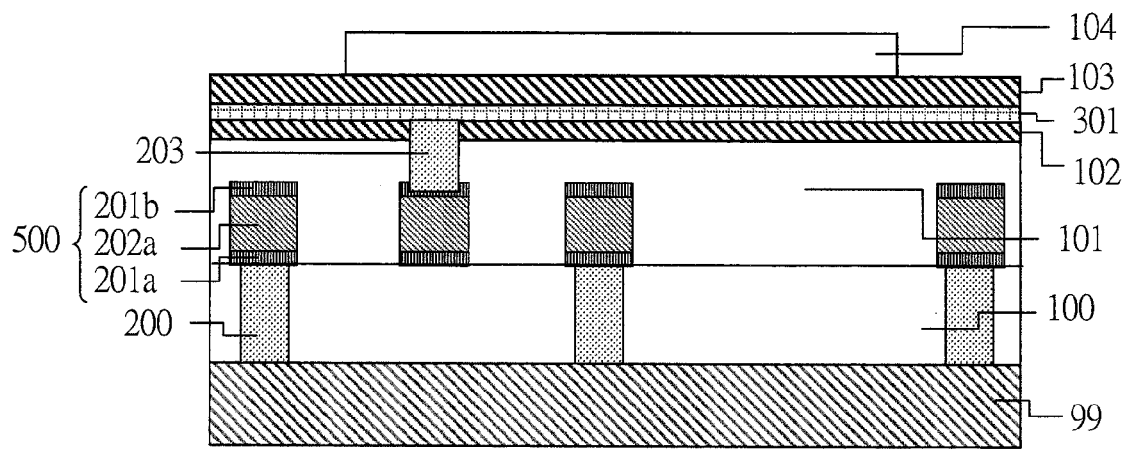
FIG. 7E is a schematic cross-sectional view showing the manufacturing process in the manufacturing method of the semiconductor device according to the first embodiment of the present invention.
Figure 7F:
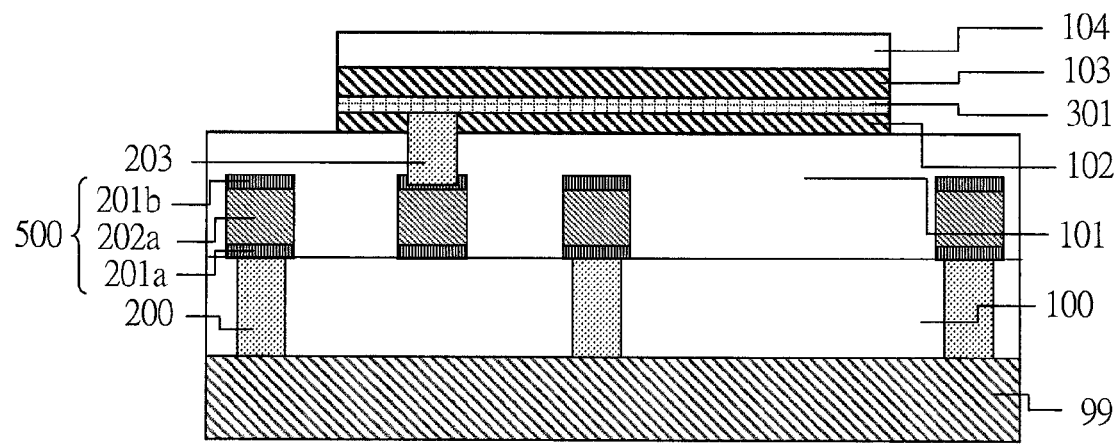
FIG. 7F is a schematic cross-sectional view showing the manufacturing process in the manufacturing method of the semiconductor device according to the first embodiment of the present invention.

Next, as shown in FIG. 7E, the insulating film 104 is processed by using the lithography method and the dry etching method so as to have the same planar shape as the metal resistor element to be formed, and then, the resist film used as the processing mask is removed in oxygen plasma atmosphere. Since the insulating film 104 is made of a material (SiO) having an etching selectivity to the upper-surface oxidation preventing layer (SiN, SiC, SiCN) 103, the upper-surface oxidation preventing layer 103 functions as an etching stopper layer in the etching of the insulating film 104. Thereafter, as shown in FIG. 7F, the upper-surface oxidation preventing layer 103, the resistive element 301 and the lower-surface oxidation preventing layer 102 are processed by the dry etching method containing no oxygen with using the processed insulating film 104 as a mask, thereby forming the metal resistor element 301, the upper-surface oxidation preventing insulating film 103 on the metal resistor element 301 and the lower-surface oxidation preventing insulating film 102 below the metal resistor element 301.

One of the features of the present invention is that the insulating film 104 having the same planar shape as the metal resistor element 301 is formed on the upper-surface oxidation preventing layer 103, and the upper-surface oxidation preventing layer 103 is etched with using the insulating film 104 as a mask. If the upper-surface oxidation preventing layer 103 is etched and removed with using a resist film as a mask without forming the insulating film 104, oxidation progresses from the exposed surface of the resistive element 301 at the time of the removal (ashing treatment) of the resist film in the oxygen plasma atmosphere, and the resistance of the metal resistor element 301 to be formed is increased. In the present invention, since the resistive element 301 is covered with the upper-surface oxidation preventing layer 103 and is not exposed at the time of the ashing treatment, the resistance of the metal resistor element 301 to be formed is not increased.

Figure 7G:
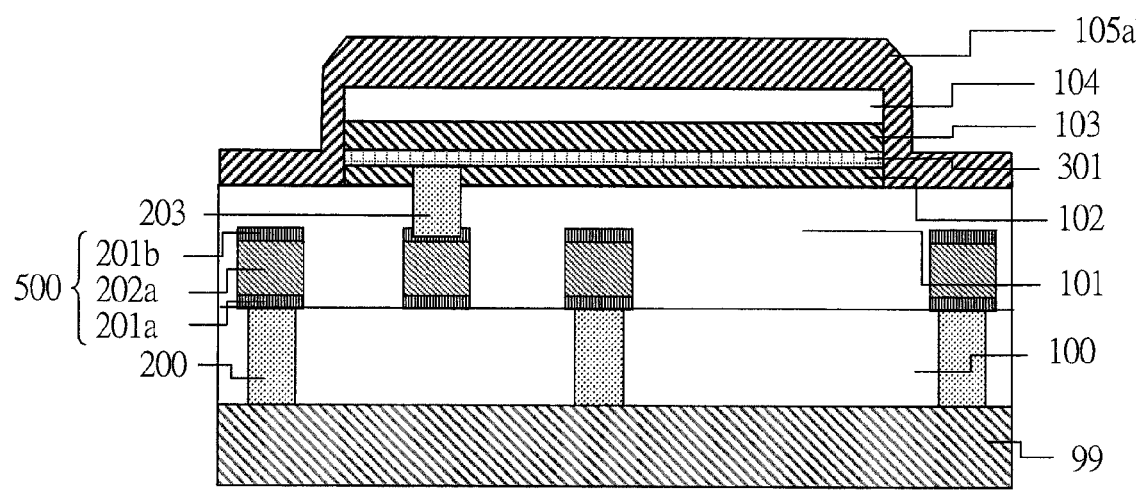
FIG. 7G is a schematic cross-sectional view showing the manufacturing process in the manufacturing method of the semiconductor device according to the first embodiment of the present invention.

Next, as shown in FIG. 7G, in order to form a side-surface oxidation preventing insulating film, an insulating film 105a made of, for example, a silicon nitride (SiN) film, a silicon carbide (SiC) film or a silicon carbon nitride (SiCN) film containing no oxygen in its formation process and the film itself is deposited to about 100 nm by using the CVD method without removing the insulating film 104.

Figure 7H:
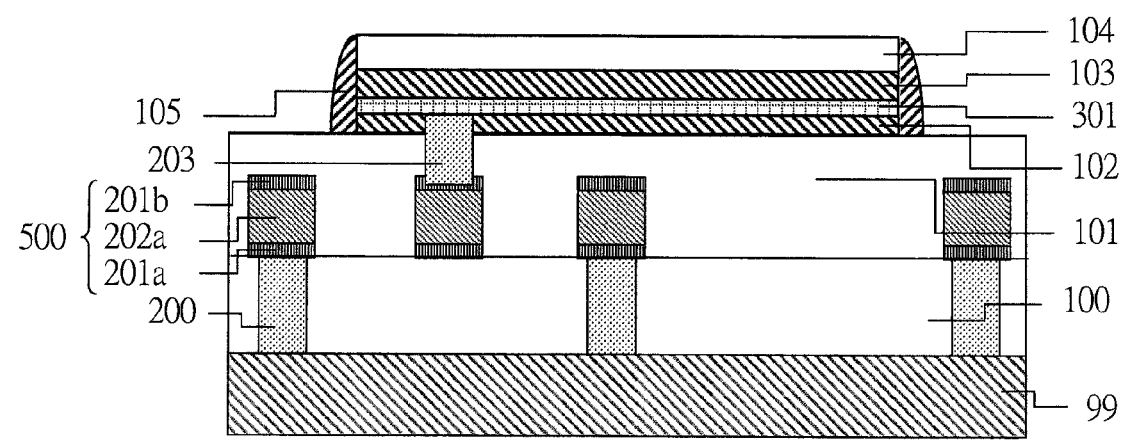
FIG. 7H is a schematic cross-sectional view showing the manufacturing process in the manufacturing method of the semiconductor device according to the first embodiment of the present invention.

Thereafter, as shown in FIG. 7H, the insulating film 105a in the region other than the side surface of the four-layer stacked film of the insulating film 104, the upper-surface oxidation preventing insulating film 103, the metal resistor element 301 and the lower-surface oxidation preventing insulating film 102 is removed by the dry etching method, thereby forming a side-surface oxidation preventing insulating film 105. The dry etching in this case is the anisotropic etching (etching rate of flat portion>etching rate of side-surface portion) and is performed under the condition that the etching rate of the insulating film 105a having an etching selectivity to the insulating film 104 is higher than that of the silicon oxide film 104 and the insulating film 104 on the upper-surface oxidation preventing insulating film 103 remains when the etching ends. The thickness in the horizontal direction of the side-surface oxidation preventing insulating film formed by the above-described anisotropic etching gradually decreases as going upward.

One of the features of the present invention is that the insulating film 104 used as the mask in the process shown in FIG. 7F is not removed, and this insulating film 104 is used as a protection film of the upper-surface oxidation preventing insulating film 103 and as a functional film for ensuring the thickness of the side-surface oxidation preventing insulating film.

If the side-surface oxidation preventing insulating film 105 is formed after removing the insulating film 104, when the same material as that of the upper-surface oxidation preventing insulating film 103 is used for the insulating film 105a, the upper surface of the upper-surface oxidation preventing insulating film 103 is also etched by the anisotropic etching, and the upper-surface oxidation preventing insulating film 103 is reduced in thickness. In the present invention, since the insulating film 104 functions as the protection film of the upper-surface oxidation preventing insulating film 103, it is possible to prevent the upper-surface oxidation preventing insulating film 103 from being thinned. Note that, when a material having an oxidation preventing function and an etching selectivity to the upper-surface oxidation preventing insulating film 103 and different from the upper-surface oxidation preventing insulating film 103 is used for the insulating film 105a, the problem of the thinning of the upper-surface oxidation preventing insulating film 103 can be suppressed to some extent. However, since several kinds of material films have to be used as the oxidation preventing insulating film, the manufacturing process is complicated and the cost increase is inevitable.

Further, if the side-surface oxidation preventing insulating film 105 is formed after removing the insulating film 104, since the side-surface oxidation preventing insulating film 105 is formed on the side surface of the three-layer stacked film of the upper-surface oxidation preventing insulating film 103, the metal resistor element 301 and the lower-surface oxidation preventing insulating film 102, the height of the side-surface oxidation preventing insulating film 105 is smaller compared with the case where it is formed on the side surface of the four-layer stacked film having the insulating film 104, and the thickness in the horizontal direction of the side-surface oxidation preventing insulating film 105 cannot be sufficiently ensured in the height portion of the metal resistor element 301. In the present invention, the height of the side surface on which the side-surface oxidation preventing insulating film 105 is formed can be increased by the insulating film 104, and the thickness in the horizontal direction of the side-surface oxidation preventing insulating film 105 can be sufficiently ensured in the height portion of the metal resistor element 301. For ensuring the sufficient thickness of the side-surface oxidation preventing insulating film 105, as described above, it is preferable to form the insulating film 104 so as to be thicker than any of the upper-surface oxidation preventing insulating film 103, the metal resistor element 301 and the lower-surface oxidation preventing insulating film 102, and it is more preferable to form the insulating film 104 so as to have the thickness larger than the thickness of the three-layer stacked film of the upper-surface oxidation preventing insulating film 103, the metal resistor element 301 and the lower-surface oxidation preventing insulating film 102.

Figure 7I:
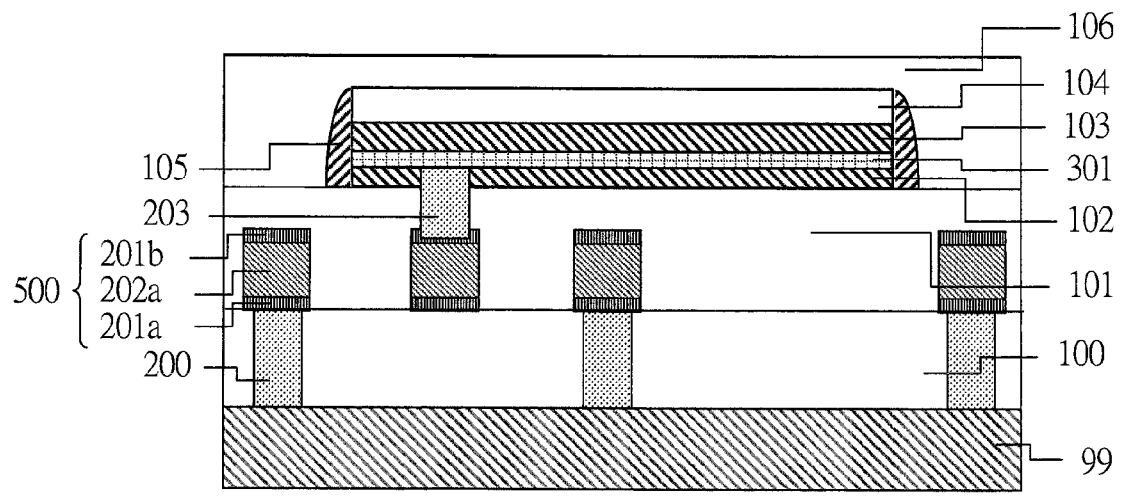
FIG. 7I is a schematic cross-sectional view showing the manufacturing process in the manufacturing method of the semiconductor device according to the first embodiment of the present invention.

FIG. 7I shows a state in which a silicon oxide film is deposited at a temperature of about 200 to 400° C. by using the CVD method and this silicon oxide film is planarized by the chemical mechanical polishing method, thereby forming a third interlayer insulating film 106.

Figure 7J:
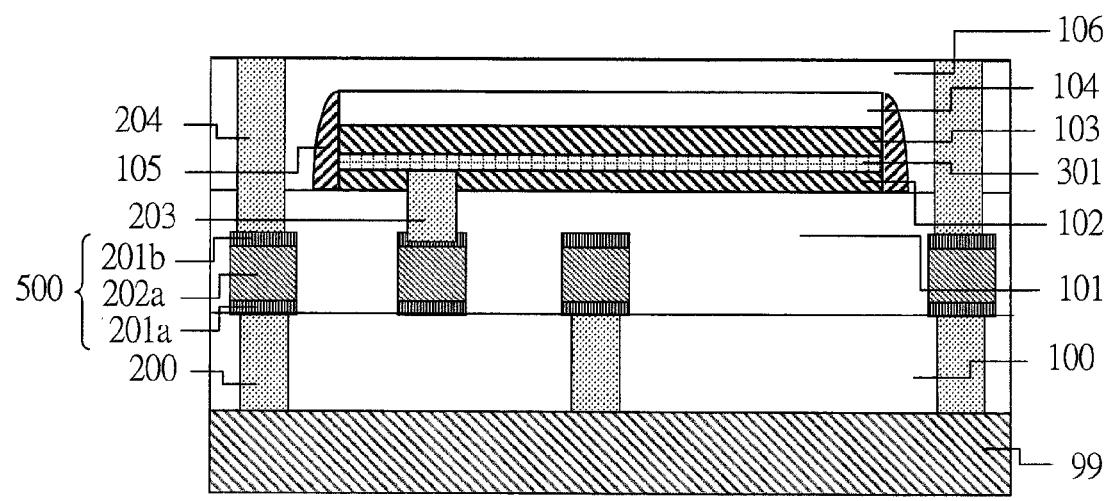
FIG. 7J is a schematic cross-sectional view showing the manufacturing process in the manufacturing method of the semiconductor device according to the first embodiment of the present invention.

FIG. 7J shows a state in which third conductive contact hole plugs 204 each composed of a barrier film having a structure including a titanium film of about 10 nm and a titanium nitride film of about 50 nm deposited on the titanium film and tungsten are formed at the portions where contact holes have been formed by using the lithography method and the dry etching method for the electrical connection between the first metal wiring layer 500 and the upper-layer wiring.

Figure 7K:
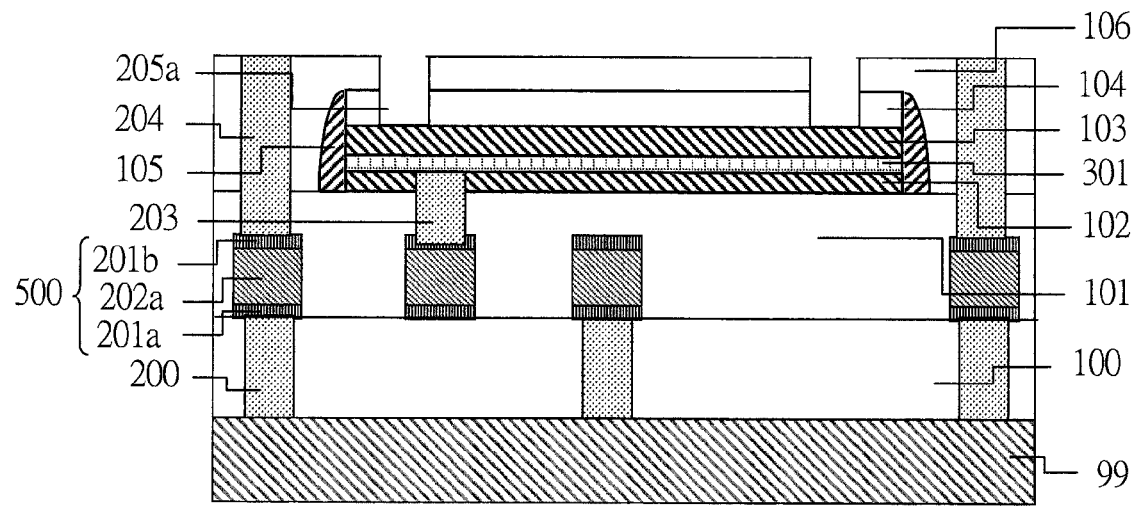
FIG. 7K is a schematic cross-sectional view showing the manufacturing process in the manufacturing method of the semiconductor device according to the first embodiment of the present invention.

FIG. 7K shows a state in which the resist film is removed after forming contact holes 205a by using the lithography method and the dry etching method for the electrical connection between the metal resistor element 301 and the upper-layer wiring. The dry etching of the contact holes 205a is performed under the condition that the etching rate of the upper-surface oxidation preventing insulating film 103 is lower than that of the third interlayer insulating film 106 and the insulating film 104 and the upper-surface oxidation preventing insulating film 103 remains when the etching of the third interlayer insulating film 106 and the insulating film 104 ends. By this means, when the resist film is removed in the oxygen plasma atmosphere after the etching, since the upper-surface oxidation preventing insulating film 103 protects the metal resistor element 301, the increase in resistance due to the oxidation of the metal resistor element 301 can be prevented. Thereafter, the upper-surface oxidation preventing insulating film 103 of the metal resistor element 301 is removed by the anisotropic dry etching using no oxygen (etching rate of flat portion>etching rate of side-surface portion) with using the pattern of the contact holes 205a as a mask without using the resist film. By this means, the metal resistor element 301 can be electrically connected to the upper-layer wiring, and at the same time, the removal of the resist film in the oxygen plasma atmosphere is unnecessary because the resist film is not used in the process, and the resistance increase due to the oxidation of the exposed metal resistor element 301 does not occur.

Figure 7L:
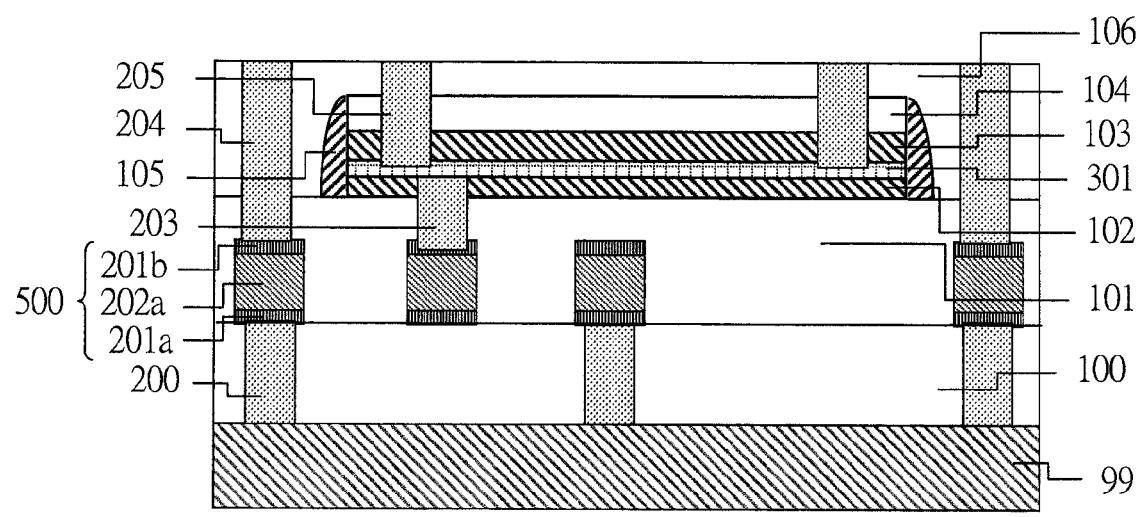
FIG. 7L is a schematic cross-sectional view showing the manufacturing process in the manufacturing method of the semiconductor device according to the first embodiment of the present invention.

FIG. 7L shows a state in which fourth conductive contact hole plugs 205 each composed of a barrier film having a structure including a titanium film of about 10 nm and a titanium nitride film of about 50 nm deposited on the titanium film and tungsten are formed for the electrical connection between the metal resistor element 301 and the upper-layer wiring.

Figure 7M:
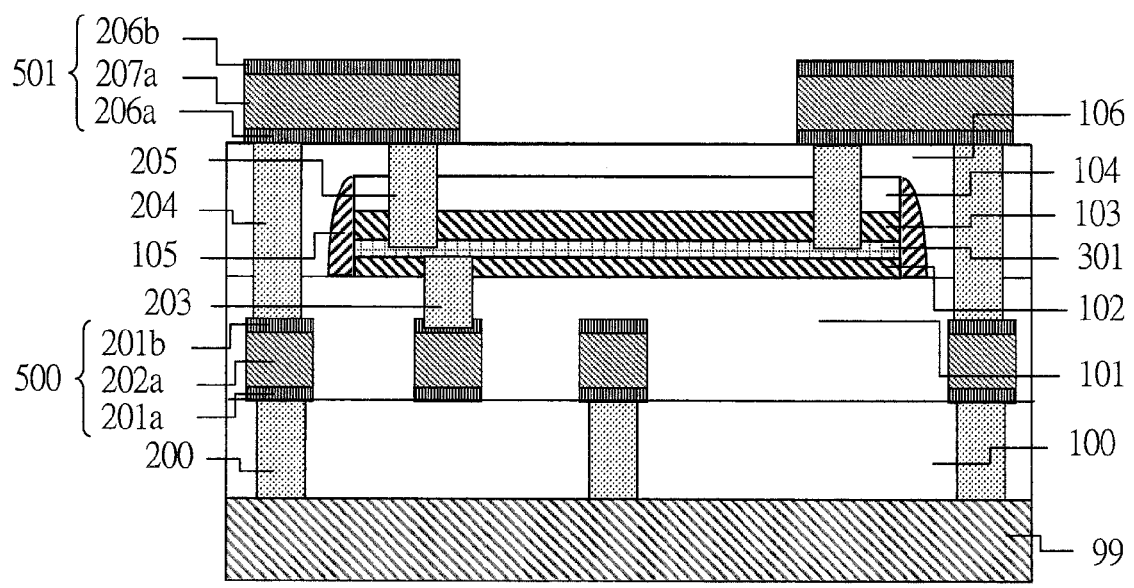
FIG. 7M is a schematic cross-sectional view showing the manufacturing process in the manufacturing method of the semiconductor device according to the first embodiment of the present invention.

FIG. 7M shows a state in which a second aluminum alloy film 207a of about 500 nm and a second lower-layer barrier film 206a and a second upper-layer barrier film 206b each including a titanium film of about 10 to 30 nm and a titanium nitride film of about 20 to 100 nm formed as upper and lower layers of the aluminum alloy film 207a are formed by the sputtering method, and second metal wiring layers 501 are formed by using the lithography method and the dry etching method.

Subsequently, a silicon oxide film is deposited at the temperature of about 200 to 400° C. by using the CVD method and this silicon oxide film is planarized by the chemical mechanical polishing method, thereby forming a fourth interlayer insulating film 107. In this manner, the semiconductor device according to the first embodiment of the present invention shown in FIG. 1 is completed.

Figure 2:
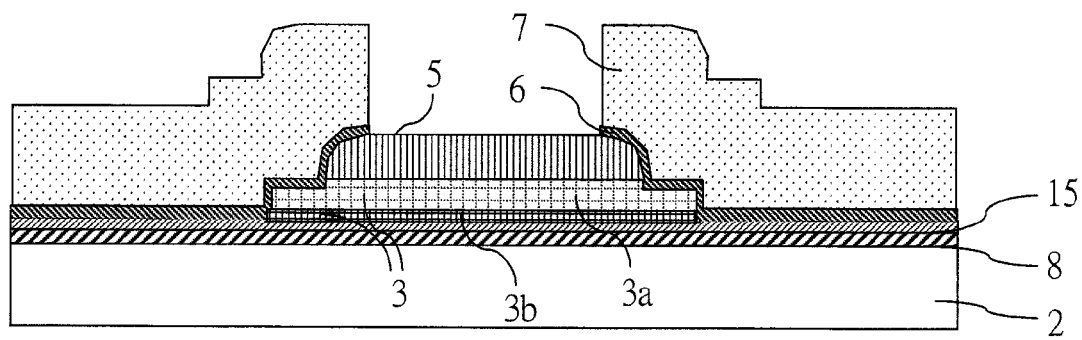
FIG. 2 is a schematic cross-sectional view of a conventional metal resistor element.
Figure 3:
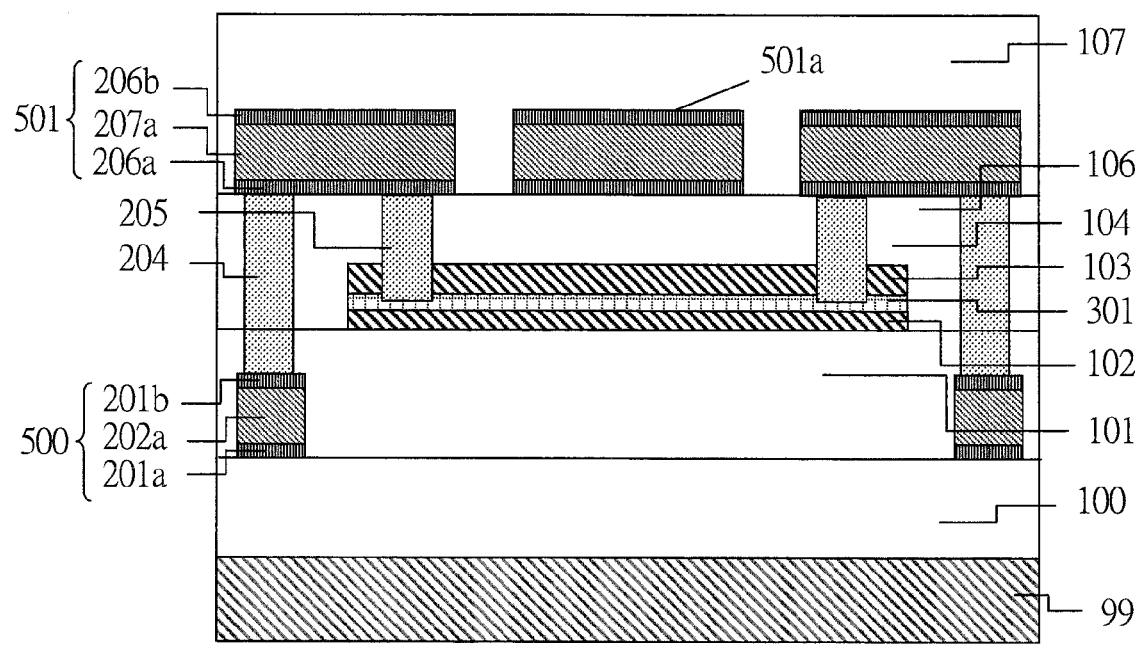
FIG. 3 is a schematic cross-sectional view of a conventional semiconductor device in which a TaN resistor element is incorporated in a LSI multilayer wiring structure (structure with an upper-layer metal wiring pattern)
Figure 4:
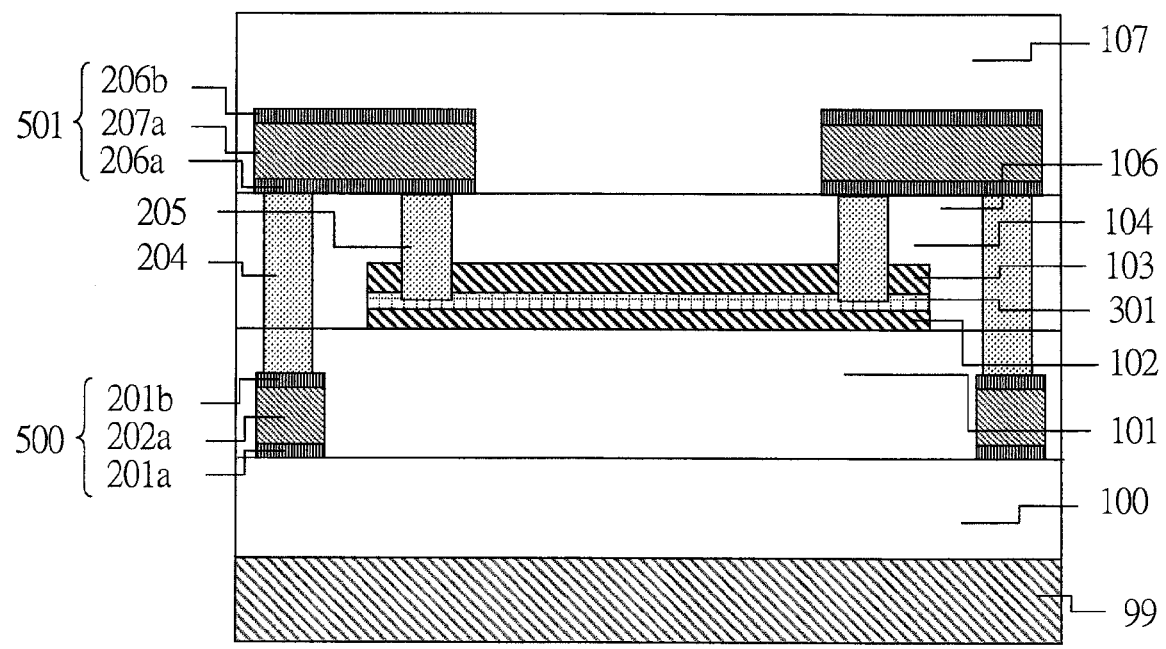
FIG. 4 is a schematic cross-sectional view of a conventional semiconductor device in which a TaN resistor element is incorporated in a LSI multilayer wiring structure (structure without an upper-layer metal wiring pattern)
Figure 5:
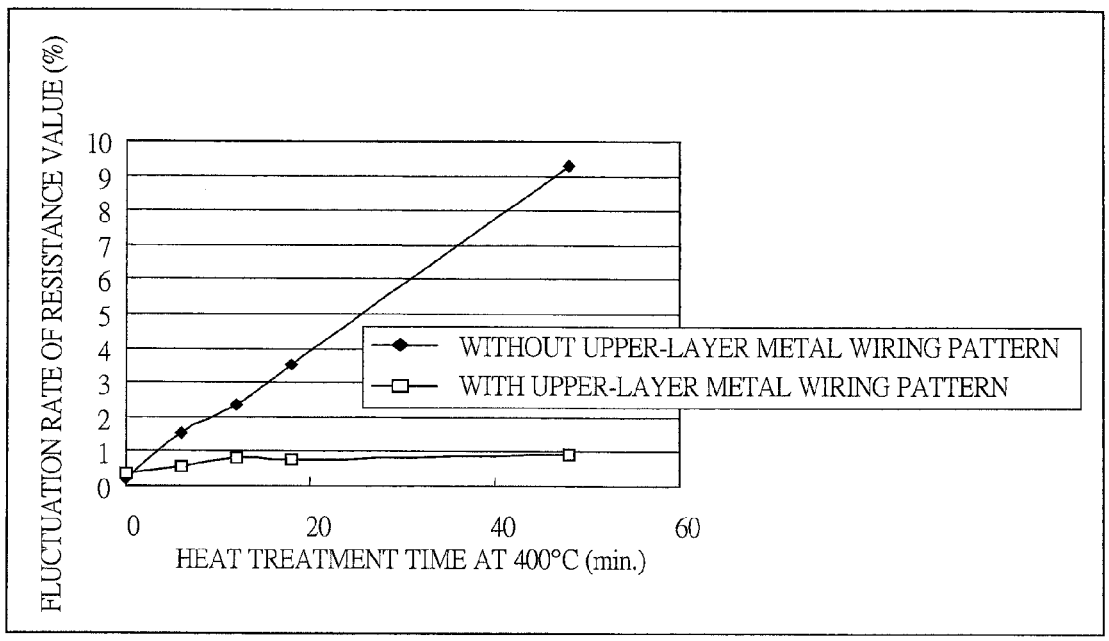
FIG. 5 is a graph showing a fluctuation rate of resistance value of a metal resistor element with respect to heat load in each of the semiconductor devices shown in FIG. 3 and FIG. 4.
Figure 6:
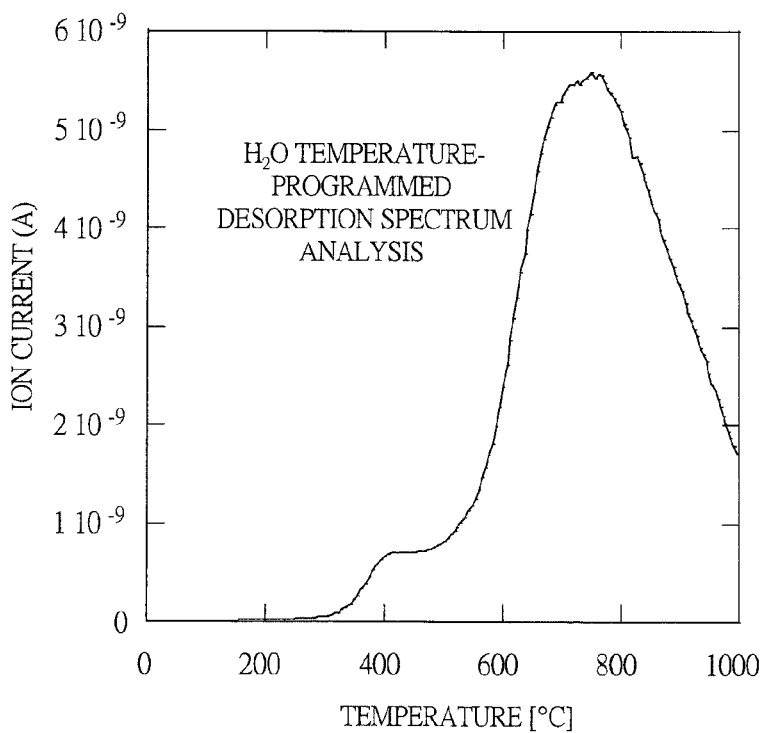
FIG. 6 is a graph showing a result of $H_2O$ temperature-programmed desorption spectrum analysis in a silicon oxide film formed by the plasma CVD method.
Figure 8:
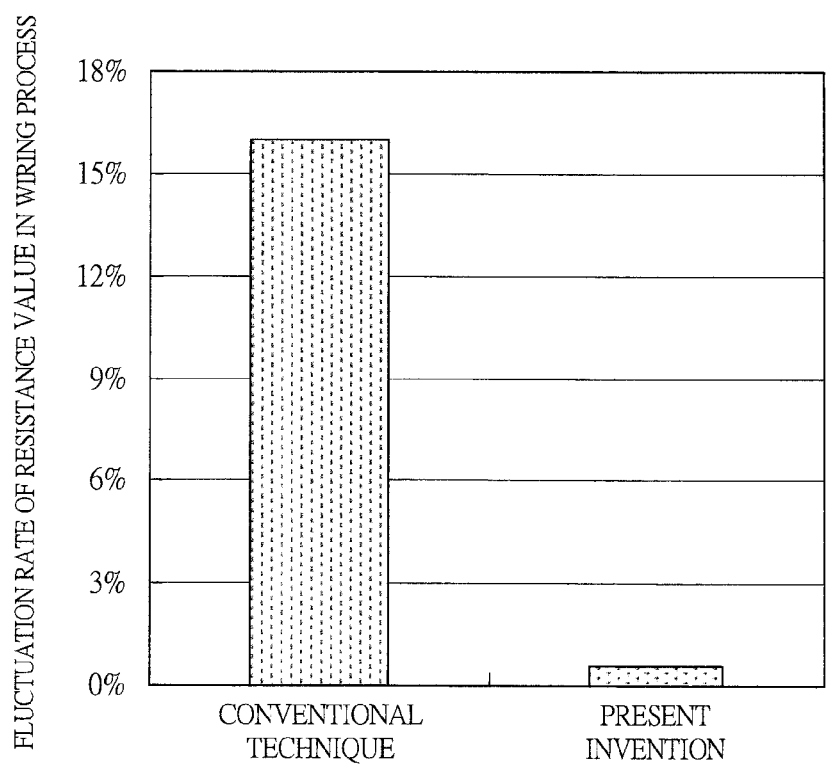
FIG. 8 is a graph showing a fluctuation rate of resistance value of a metal resistor element with respect to heat load in the semiconductor device according to the first embodiment of the present invention.

In the semiconductor device according to the first embodiment of the present invention, the side surface of the metal resistor element 301 is covered with the side-surface oxidation preventing insulating film 105, and thus, it is possible to prevent the increase of the resistance value due to the oxidation of the metal resistor element 301. FIG. 8 shows the result that the problem of the dependence on the upper and lower wiring pattern layout is solved by preventing the oxidation of the metal resistor element in the structure of the first embodiment. Conventionally, in the case where the upper-layer metal wiring pattern is not provided as shown in FIG. 4, the resistance value of the metal resistor element 301 is increased due to the oxidation as shown in FIG. 5, and when the heat treatment corresponding to about 400° C. for 80 minutes is added in the multilayer wiring process, the fluctuation rate of the resistance value reaches as high as 16% as shown in the left side of FIG. 8. Meanwhile, in the present invention, even if the upper-layer metal wiring pattern is not provided as shown in FIG. 2, the extremely stable result, that is, the fluctuation rate of the resistance value of 1% or lower can be obtained as shown in the right side of FIG. 8 even when the heat treatment corresponding to about 400° C. for 80 minutes is added in the multilayer wiring process after forming the metal resistor element 301 made of TaN.

Also, the side-surface oxidation preventing insulating film 105 in the present invention is formed by depositing the insulating film 105a having an oxidation barrier function on the whole surface and then removing the insulating film 105a in the region other than that near the side surface of the metal resistor element 301, that is, the insulating film 105a above the metal resistor element 301 and on the second interlayer insulating film 101 by the anisotropic etching without using any special mask. Therefore, it is possible to prevent the increase of the parasitic capacitance between metal wiring layers without complicating the fabrication process.

Note that the effects of the prevention of the resistance value increase and the prevention of the parasitic capacitance increase according to the present invention can be obtained even when the insulating film 104 is not formed on the upper-surface oxidation preventing insulating film 103.

Although the wiring layer mainly made of an aluminum alloy film processed by the dry etching method is used for the first metal wiring layer 500 and the second metal wiring layer 501, and the metal film mainly made of tungsten is used for the conductive contact hole plugs 204 for connecting them. However, it is also possible to use an aluminum wiring layer and a copper wiring layer formed by damascene method instead, and this case will be described in detail in the following second embodiment.

Second Embodiment

Figure 9:
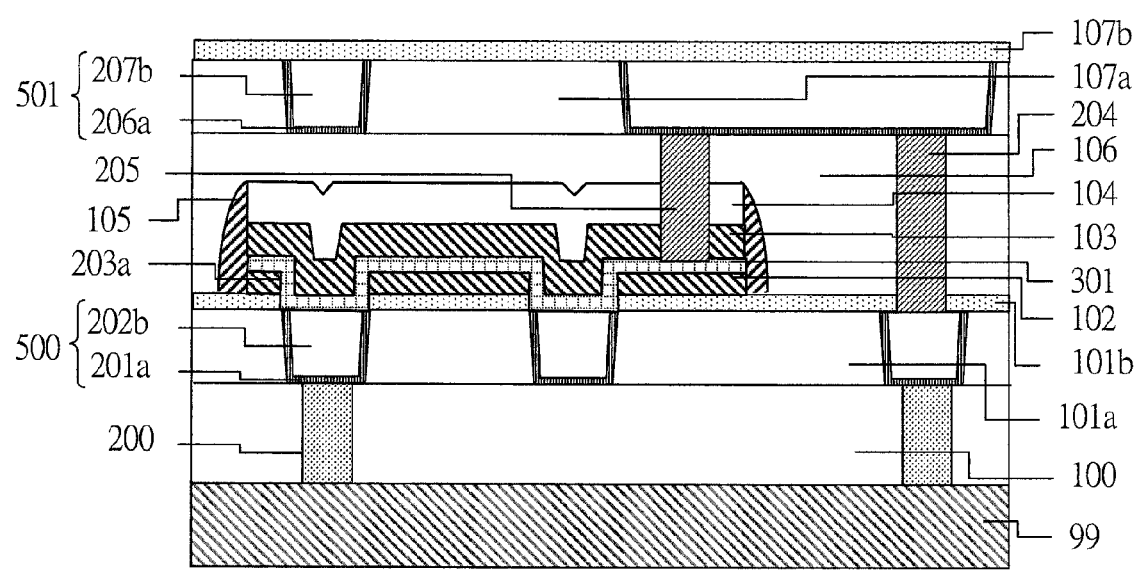
FIG. 9 is a schematic cross-sectional view of a semiconductor device according to the second embodiment of the present invention.

FIG. 9 is a schematic cross-sectional view showing a semiconductor device according to the second embodiment of the present invention. Also, FIG. 10A to FIG. 10L are schematic cross-sectional views showing the manufacturing method of the semiconductor device according to the second embodiment of the present invention. The manufacturing method will be described below in due order.

Figure 10A:
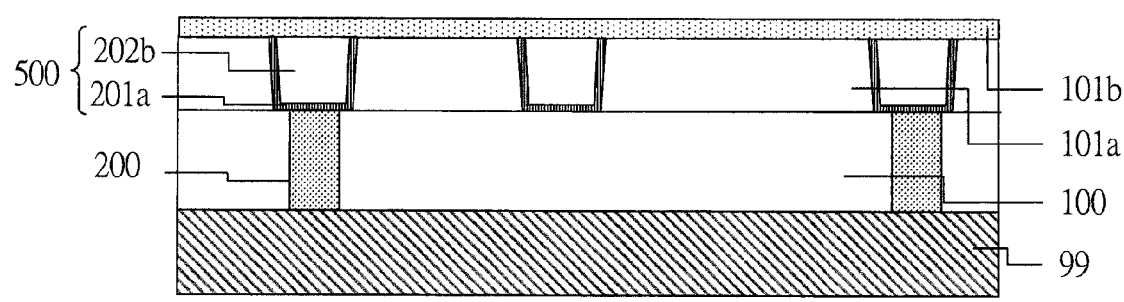
FIG. 10A is a schematic cross-sectional view showing the manufacturing process in the manufacturing method of the semiconductor device according to the second embodiment of the present invention.

FIG. 10A shows a multilayer wiring structure formed below a metal resistor element. First, after forming a first interlayer insulating film 100 of about 1000 nm made of a silicon nitride film or a silicon oxide film on a semiconductor substrate 99, first conductive contact hole plugs 200 each composed of a barrier film having a structure including a titanium film of about 10 nm and a titanium nitride film of about 20 nm deposited on the titanium film and tungsten are formed. Next, a first damascene interlayer insulating film 101a made of a silicon oxide layer containing silicon oxide and fluorine or carbon is deposited by the CVD method, and the first damascene interlayer insulating film 101a at the portions where first metal wiring layers 500 are to be formed is removed by using the lithography method and the dry etching method. Thereafter, a first lower-layer barrier film 201a obtained by depositing tantalum of about 10 nm and tantalum nitride of about 10 nm formed thereon is formed by using the sputtering method, and then, a first copper wiring film 202b is formed by using the sputtering method and the plating method, and the first copper wiring film 202b and the first lower-layer barrier film 201a present on the upper surface of the first damascene interlayer insulating film 101a are removed by the chemical mechanical polishing method, thereby forming the first metal wiring layers 500. On the first metal wiring layers 500, a SiCN film is deposited by the CVD method as a first copper diffusion preventing insulating film 101b.

Figure 10B:
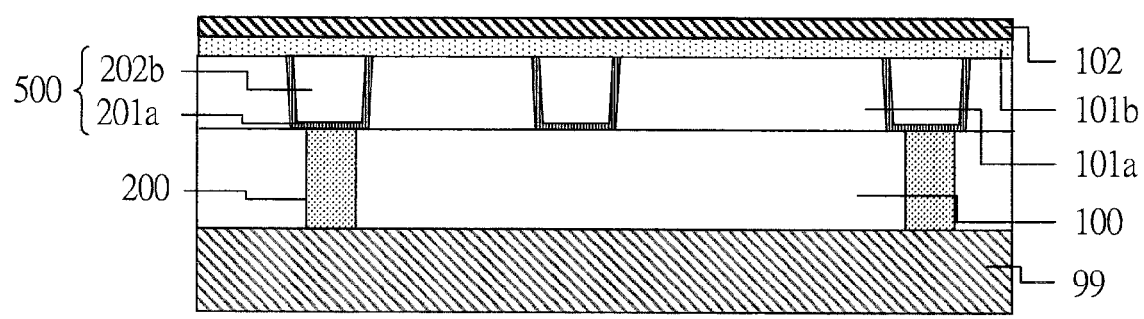
FIG. 10B is a schematic cross-sectional view showing the manufacturing process in the manufacturing method of the semiconductor device according to the second embodiment of the present invention.

FIG. 10B shows a state in which an insulating film 102 of about 50 nm made of, for example, a silicon nitride (SiN) film, a silicon carbide (SiC) film or a silicon carbon nitride (SiCN) film containing no oxygen in its formation process and the film itself is deposited as the lower-surface oxidation preventing insulating film of the metal resistor element by using the CVD method on the structure shown in FIG. 10A.

Figure 10C:
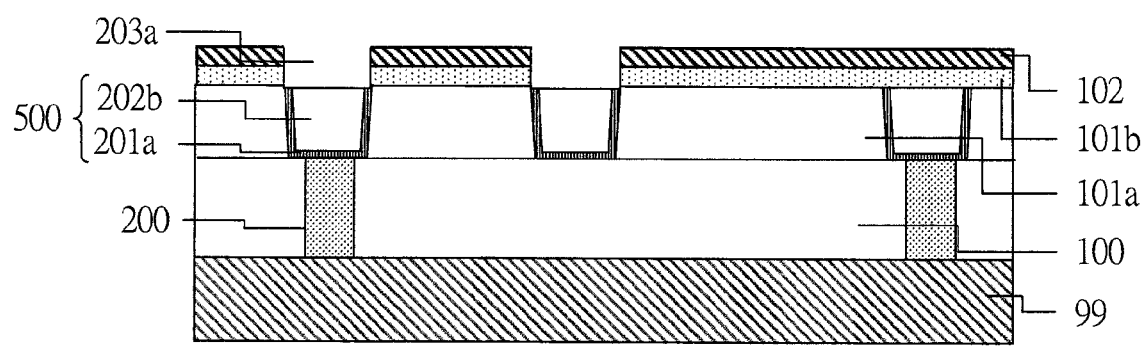
FIG. 10C is a schematic cross-sectional view showing the manufacturing process in the manufacturing method of the semiconductor device according to the second embodiment of the present invention.

FIG. 10C shows a state in which contact holes 203a are formed by using the lithography method and the dry etching method for the electrical connection between the first metal wiring layer 500 and the metal resistor element.

Figure 10D:
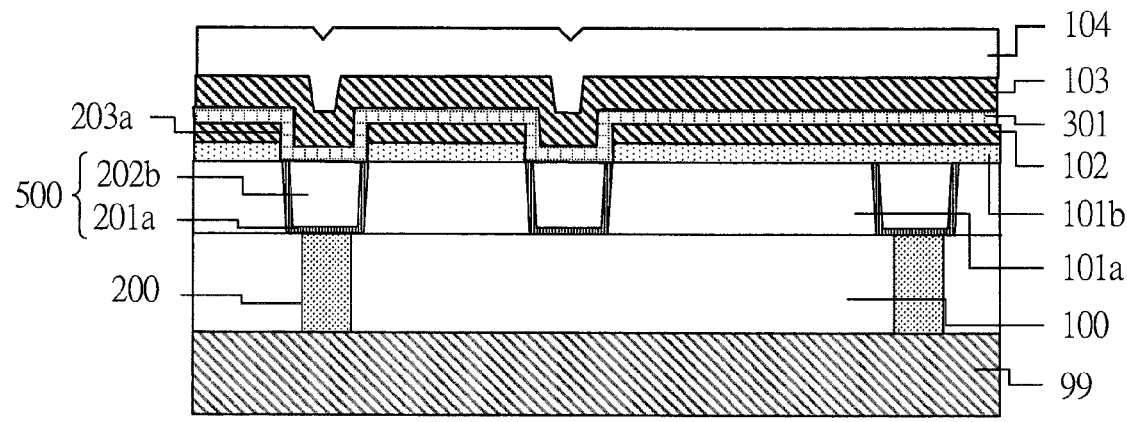
FIG. 10D is a schematic cross-sectional view showing the manufacturing process in the manufacturing method of the semiconductor device according to the second embodiment of the present invention.

Next, as shown in FIG. 10D, on the resistive element 301 to be the metal resistor element made of a metal film, a metal nitride film or a metal silicide film deposited to about 10 to 50 nm, an insulating film 103 of about 50 nm made of, for example, a silicon nitride (SiN) film, a silicon carbide (SiC)

film or a silicon carbon nitride (SiCN) film containing no oxygen in its formation process and the film itself is deposited as the upper-surface oxidation preventing layer by using the CVD method. Further, an insulating film 104 made of a material different from that of the upper-surface oxidation preventing layer 103 and having an etching selectivity to the upper-surface oxidation preventing layer 103 is deposited. This insulating film 104 is one of the features of the present invention, and it is preferable to form the insulating film 104 so as to be thicker than any of the upper-surface oxidation preventing layer 103, the resistive element 301 and the lower-surface oxidation preventing layer 102. It is more preferable to form the insulating film 104 so as to have the thickness larger than the thickness of the three layers of the upper-surface oxidation preventing layer 103, the resistive element 301 and the lower-surface oxidation preventing layer 102. In this embodiment, a silicon oxide film is deposited to about 100 to 200 nm as the insulating film 104.

Figure 10E:
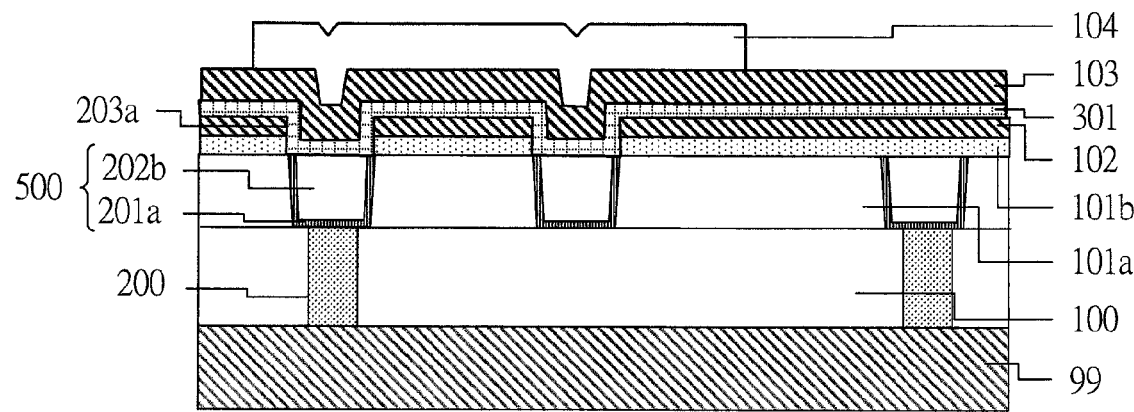
FIG. 10E is a schematic cross-sectional view showing the manufacturing process in the manufacturing method of the semiconductor device according to the second embodiment of the present invention.
Figure 10F:
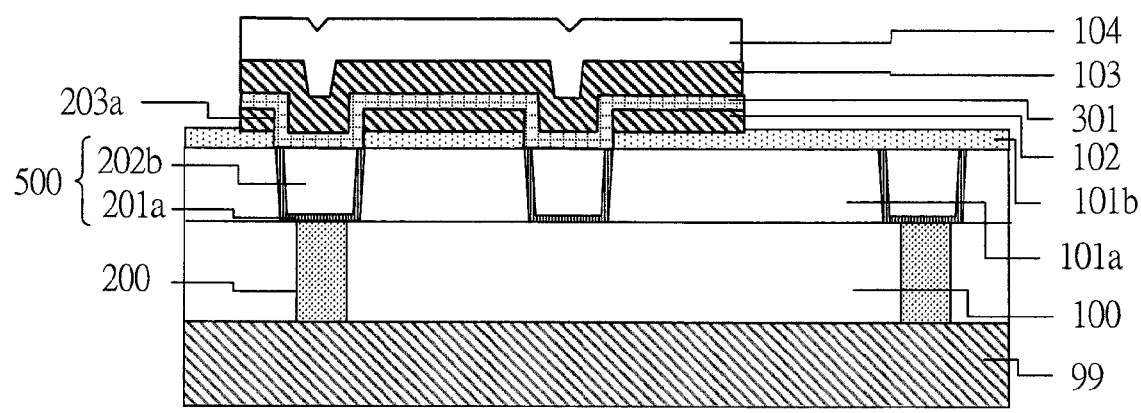
FIG. 10F is a schematic cross-sectional view showing the manufacturing process in the manufacturing method of the semiconductor device according to the second embodiment of the present invention.

Next, as shown in FIG. 10E, the insulating film 104 is processed by using the lithography method and the dry etching method so as to have the same planar shape as the metal resistor element, and then, the resist film used as the processing mask is removed in oxygen plasma atmosphere. Since the insulating film 104 is made of a material (SiO) having an etching selectivity to the upper-surface oxidation preventing layer (SiN, SiC, SiCN) 103, the upper-surface oxidation preventing layer 103 functions as an etching stopper layer in the etching of the insulating film 104. Thereafter, as shown in FIG. 10F, the upper-surface oxidation preventing layer 103, the resistive element 301 and the lower-surface oxidation preventing layer 102 are processed by using the dry etching method containing no oxygen with using the processed insulating film 104 as a mask, thereby forming the metal resistor element 301, the upper-surface oxidation preventing insulating film 103 on the metal resistor element 301 and the lower-surface oxidation preventing insulating film 102 below the metal resistor element 301.

One of the features of the present invention is that the insulating film 104 having the same planar shape as the metal resistor element 301 is formed on the upper-surface oxidation preventing layer 103, and the upper-surface oxidation preventing layer 103 is etched with using the insulating film 104 as a mask. If the upper-surface oxidation preventing layer 103 is etched and removed with using a resist film as a mask without forming the insulating film 104, oxidation progresses from the exposed surface of the resistive element 301 at the time of the removal (ashing treatment) of the resist film in the oxygen plasma atmosphere, and the resistance of the metal resistor element 301 to be formed is increased. In the present invention, since the resistive element 301 is covered with the upper-surface oxidation preventing layer 103 and is not exposed at the time of the ashing treatment, the resistance of the metal resistor element 301 to be formed is not increased.

Figure 10G:
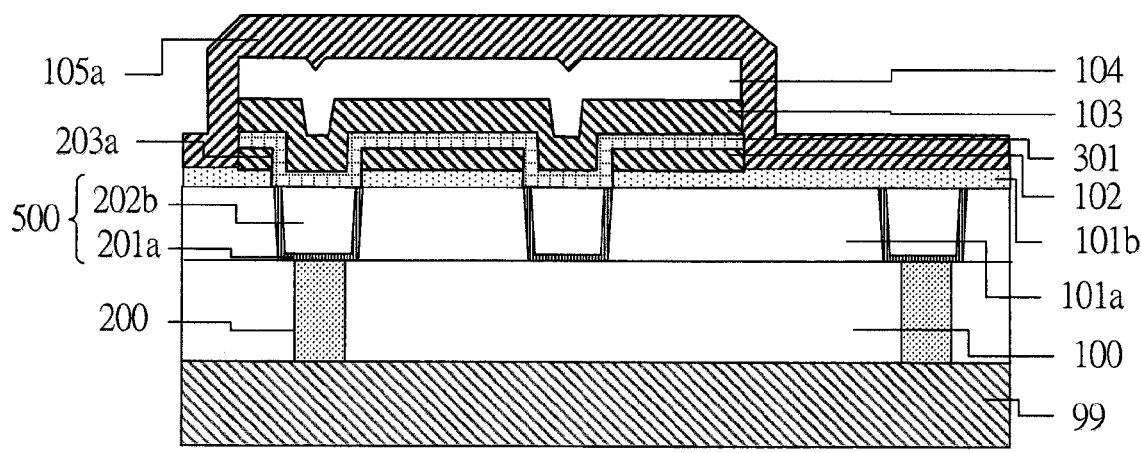
FIG. 10G is a schematic cross-sectional view showing the manufacturing process in the manufacturing method of the semiconductor device according to the second embodiment of the present invention.

Next, as shown in FIG. 10G, in order to form a side-surface oxidation preventing insulating film, an insulating film 105a made of, for example, a silicon nitride (SiN) film, a silicon carbide (SiC) film or a silicon carbon nitride (SiCN) film containing no oxygen in its formation process and the film itself is deposited to about 100 nm by using the CVD method without removing the insulating film 104.

Figure 10H:
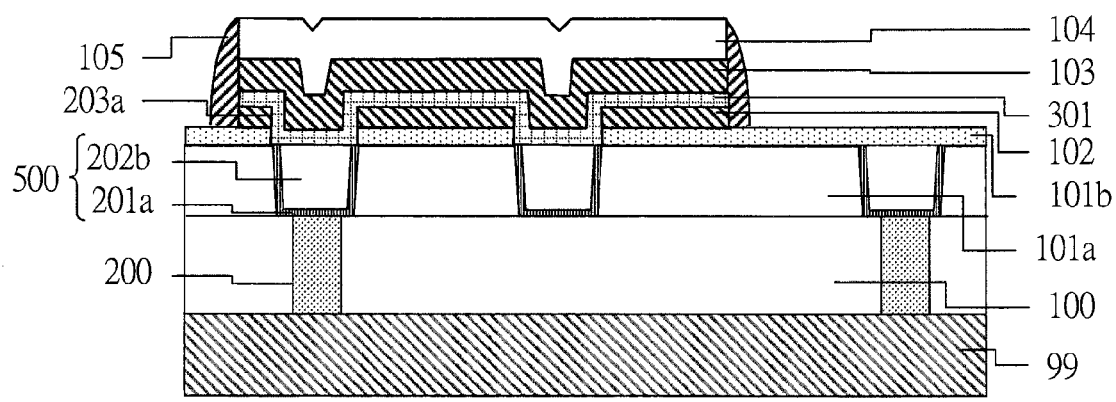
FIG. 10H is a schematic cross-sectional view showing the manufacturing process in the manufacturing method of the semiconductor device according to the second embodiment of the present invention.

Thereafter, as shown in FIG. 10H, the insulating film 105a in the region other than the side surface of the four-layer stacked film of the insulating film 104, the upper-surface oxidation preventing insulating film 103, the metal resistor element 301 and the lower-surface oxidation preventing insulating film 102 is removed by the dry etching method, thereby forming a side-surface oxidation preventing insulating film 105. The dry etching in this case is the anisotropic etching (etching rate of flat portion>etching rate of side-surface portion) and is performed under the condition that the etching rate of the insulating film 105a having an etching selectivity to the insulating film 104 is higher than that of the silicon oxide film 104 and the insulating film 104 on the upper-surface oxidation preventing insulating film 103 remains when the etching ends. The thickness in the horizontal direction of the side-surface oxidation preventing insulating film formed by the above-described anisotropic etching gradually decreases as going upward.

One of the features of the present invention is that the insulating film 104 used as the mask in the process shown in FIG. 10F is not removed, and this insulating film 104 is used as a protection film of the upper-surface oxidation preventing insulating film 103 and as a functional film for ensuring the thickness of the side-surface oxidation preventing insulating film.

If the side-surface oxidation preventing insulating film 105 is formed after removing the insulating film 104, when the same material as that of the upper-surface oxidation preventing insulating film 103 is used for the insulating film 105a, the upper surface of the upper-surface oxidation preventing insulating film 103 is also etched by the anisotropic etching, and the upper-surface oxidation preventing insulating film 103 is reduced in thickness. In the present invention, since the insulating film 104 functions as the protection film of the upper-surface oxidation preventing insulating film 103, it is possible to prevent the upper-surface oxidation preventing insulating film 103 from being thinned. Note that, when a material having an oxidation preventing function and an etching selectivity to the upper-surface oxidation preventing insulating film 103 and different from the upper-surface oxidation preventing insulating film 103 is used for the insulating film 105a, the problem of the thinning of the upper-surface oxidation preventing insulating film 103 can be suppressed to some extent. However, since several kinds of material films have to be used as the oxidation preventing insulating film, the manufacturing process is complicated and the cost increase is inevitable.

Further, if the side-surface oxidation preventing insulating film 105 is formed after removing the insulating film 104, since the side-surface oxidation preventing insulating film 105 is formed on the side surface of the three-layer stacked film of the upper-surface oxidation preventing insulating film 103, the metal resistor element 301 and the lower-surface oxidation preventing insulating film 102, the height of the side-surface oxidation preventing insulating film 105 is smaller compared with the case where it is formed on the side surface of the four-layer stacked film having the insulating film 104, and the thickness in the horizontal direction of the side-surface oxidation preventing insulating film 105 cannot be sufficiently ensured in the height portion of the metal resistor element 301. In the present invention, the height of the side surface on which the side-surface oxidation preventing insulating film 105 is formed can be increased by the insulating film 104, and the thickness in the horizontal direction of the side-surface oxidation preventing insulating film 105 can be sufficiently ensured in the height portion of the metal resistor element 301. For ensuring the sufficient thickness of the side-surface oxidation preventing insulating film 105, as described above, it is preferable to form the insulating film 104 so as to be thicker than any of the upper-surface oxidation preventing insulating film 103, the metal resistor element 301 and the lower-surface oxidation preventing insulating film 102, and it is more preferable to form the insulating film 104 so as to have the thickness larger than the thickness of the three-layer stacked film of the upper-surface oxidation preventing insulating film 103, the metal resistor element 301 and the lower-surface oxidation preventing insulating film 102.

Figure 10I:
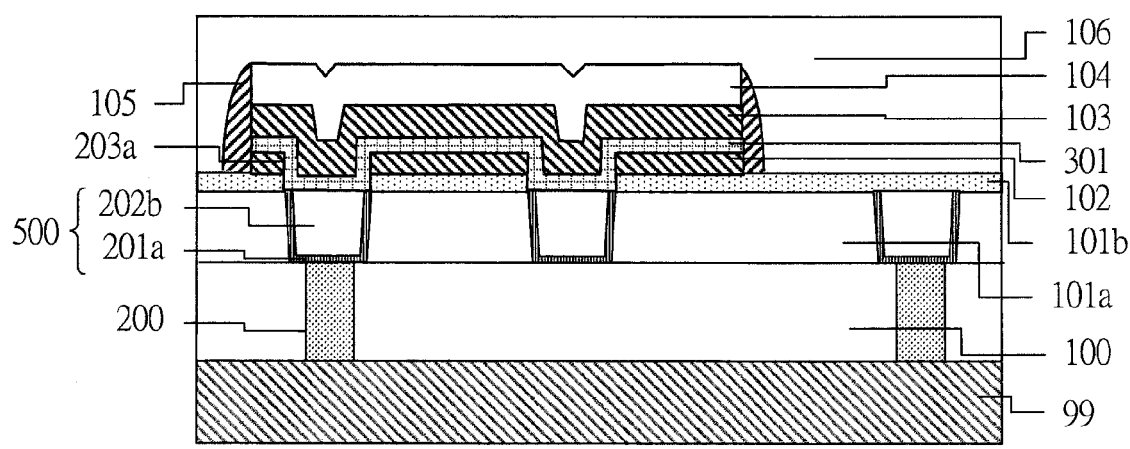
FIG. 10I is a schematic cross-sectional view showing the manufacturing process in the manufacturing method of the semiconductor device according to the second embodiment of the present invention.

FIG. 10I shows a state in which a silicon oxide layer containing silicon oxide and fluorine or carbon is deposited by using the CVD method and this silicon oxide layer is planarized by the chemical mechanical polishing method, thereby forming a third interlayer insulating film 106.

Figure 10J:
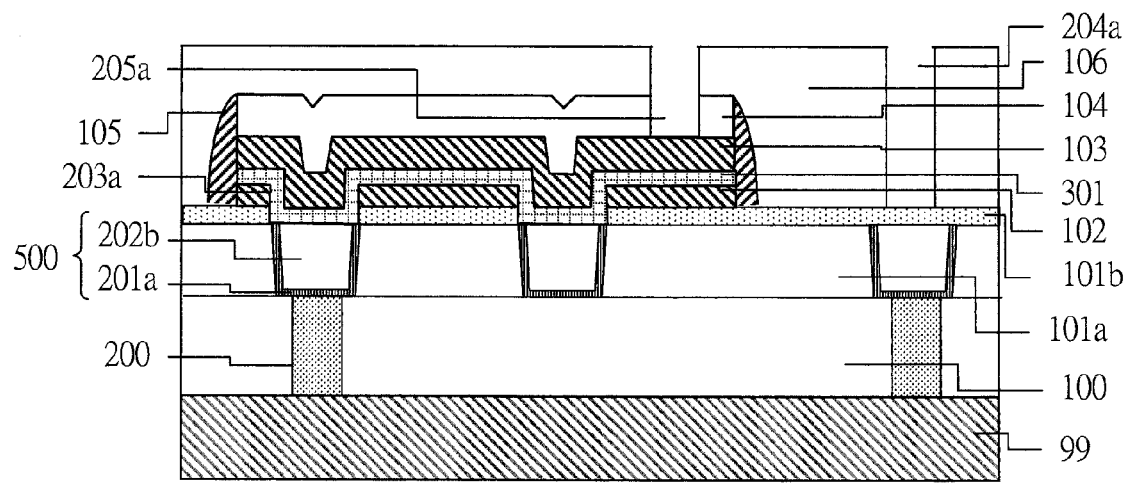
FIG. 10J is a schematic cross-sectional view showing the manufacturing process in the manufacturing method of the semiconductor device according to the second embodiment of the present invention.

FIG. 10J shows a state in which the resist film is removed after forming contact holes 204a and 205a by using the lithography method and the dry etching method for the electrical connection between the first metal wiring layer 500 and metal resistor element 301 and the upper-layer wiring. The dry etching of the contact holes 204a and 205a is performed under the condition that the etching rate of the third interlayer insulating film 106 and the insulating film 104 is higher than that of the first copper diffusion preventing insulating film 101b and the upper-surface oxidation preventing insulating film 103 and the first copper diffusion preventing insulating film 101b and the upper-surface oxidation preventing insulating film 103 remain when the etching ends. By this means, when the resist film is removed in the oxygen plasma atmosphere after the etching, since the upper-surface oxidation preventing insulating film 103 protects the metal resistor element 301, the increase in resistance due to the oxidation of the metal resistor element 301 can be prevented. Thereafter, the upper-surface oxidation preventing insulating film 103 on the metal resistor element 301 and the first copper diffusion preventing insulating film 101b on the first metal wiring layer 500 are removed by the anisotropic dry etching using no oxygen (etching rate of flat portion>etching rate of side-surface portion) with using the pattern of the contact holes 204a and 205a as a mask without using the resist film. By this means, the first metal wiring layer 500 and the metal resistor element 301 can be electrically connected to the upper-layer wiring. Further, the removal of the resist film in the oxygen plasma atmosphere is unnecessary because the resist film is not used in the process, and the resistance increase due to the oxidation of the exposed metal resistor element 301 does not occur.

Figure 10K:
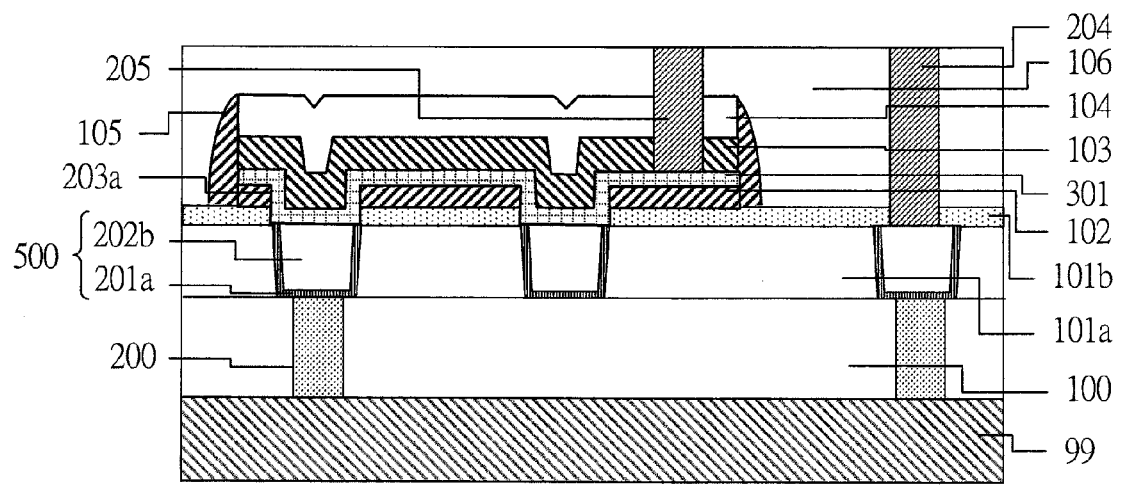
FIG. 10K is a schematic cross-sectional view showing the manufacturing process in the manufacturing method of the semiconductor device according to the second embodiment of the present invention.

FIG. 10K shows a state in which a third conductive contact hole plug 204 and a fourth conductive contact hole plug 205 each composed of a barrier film having a structure including a tantalum film of about 10 nm and a tantalum nitride film of about 10 nm deposited on the tantalum film and copper are formed at the portions of the contact holes 204a and 205a formed for the electrical connection between the first metal wiring layer 500 and metal resistor element 301 and the upper-layer wiring.

Figure 10L:
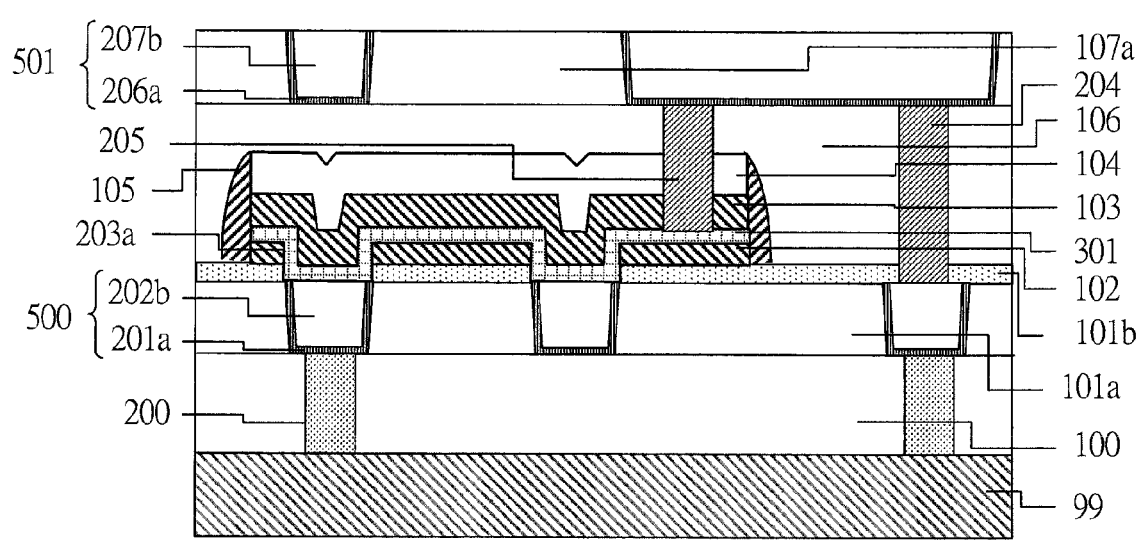
FIG. 10L is a schematic cross-sectional view showing the manufacturing process in the manufacturing method of the semiconductor device according to the second embodiment of the present invention.

FIG. 10L shows a state in which, after a second damascene interlayer insulating film 107a made of a silicon oxide layer containing silicon oxide and fluorine or carbon is deposited by the CVD method and the second damascene interlayer insulating film 107a in the region where a second metal wiring layer 501 is to be formed is removed by using the lithography method and the dry etching method, a second lower-layer barrier film 206a obtained by depositing tantalum of about 10 nm and tantalum nitride of about 10 nm thereon is formed by using the sputtering method and a second copper wiring film 207b is formed by using the sputtering method and the plating method, and then, the second copper wiring film 207b and the second lower-layer barrier film 206a on the upper surface of the second damascene interlayer insulating film 107a are removed by the chemical mechanical polishing method, thereby forming the second metal wiring layer 501.

Subsequently, a SiCN film 107b is deposited as a second copper diffusion preventing insulating film 107b by using the CVD method. In this manner, the semiconductor device according to the second embodiment of the present invention shown in FIG. 9 is completed.

In the semiconductor device according to the second embodiment of the present invention, the side surface of the metal resistor element 301 is covered with the side-surface oxidation preventing insulating film 105 like in the first embodiment, and thus, it is possible to prevent the increase of the resistance value due to the oxidation of the metal resistor element 301, and at the same time, it is possible to prevent the increase of the parasitic capacitance between the metal wiring layers without complicating the fabrication process.

What is claimed is:

1. A semiconductor device comprising:
   a first metal wiring layer formed above a semiconductor substrate;
   a first interlayer insulating film formed on the first metal wiring layer;
   a lower-surface oxidation preventing insulating film formed on a second interlayer insulating film;
   a metal resistor element film formed on the lower-surface oxidation preventing insulating film;
   an upper-surface oxidation preventing insulating film formed on the metal resistor element film;
   a side-surface oxidation preventing insulating film formed only near a side surface of the metal resistor element film;
   the second interlayer insulating film formed on the first interlayer insulating film so as to cover a structure composed of the lower-surface oxidation preventing insulating film, the metal resistor element film, the upper-surface oxidation preventing insulating film and the side-surface oxidation preventing insulating film; and
   a second metal wiring layer formed on the second interlayer insulating film.

2. The semiconductor device according to claim 1, wherein the lower-surface oxidation preventing insulating film, the upper-surface oxidation preventing insulating film and the side-surface oxidation preventing insulating film are any one of a silicon nitride film, a silicon carbide film and a silicon carbon nitride film.

3. The semiconductor device according to claim 1, wherein the second interlayer insulating film is a silicon oxide film formed by a plasma CVD method.

4. The semiconductor device according to claim 1, wherein the metal resistor element film is any one of a metal film, a metal nitride film and a metal silicide film.

5. A semiconductor device comprising:
   a first metal wiring layer formed above a semiconductor substrate;
   a first interlayer insulating film formed on the first metal wiring layer;
   a lower-surface oxidation preventing insulating film formed on a second interlayer insulating film;
   a metal resistor element film formed on the lower-surface oxidation preventing insulating film;
   an upper-surface oxidation preventing insulating film formed on the metal resistor element film;
   an insulating film which is formed on the upper-surface oxidation preventing insulating film and is made of a material different from that of the upper-surface oxidation preventing insulating film;
   a side-surface oxidation preventing insulating film which covers each side surface of the lower-surface oxidation preventing insulating film, the metal resistor element film and the upper-surface oxidation preventing insulating film and whose thickness in a horizontal direction gradually decreases as going upward;

the second interlayer insulating film formed on the first interlayer insulating film so as to cover a structure composed of the lower-surface oxidation preventing insulating film, the metal resistor element film, the upper-surface oxidation preventing insulating film, the insulating film and the side-surface oxidation preventing insulating film; and a second metal wiring layer formed on the second interlayer insulating film.

6. The semiconductor device according to claim 5, wherein the lower-surface oxidation preventing insulating film, the upper-surface oxidation preventing insulating film and the side-surface oxidation preventing insulating film are any one of a silicon nitride film, a silicon carbide film and a silicon carbon nitride film, and the insulating film is a silicon oxide film.

7. The semiconductor device according to claim 5, wherein the second interlayer insulating film is a silicon oxide film formed by a plasma CVD method.

8. The semiconductor device according to claim 5, wherein the metal resistor element film is any one of a metal film, a metal nitride film and a metal silicide film.

9. The semiconductor device according to claim 5, wherein a thickness of the insulating film is larger than a thickness of any of the lower-surface oxidation preventing insulating film, the metal resistor element film and the upper-surface oxidation preventing insulating film.

10. The semiconductor device according to claim 9, wherein the thickness of the insulating film is larger than a thickness of a three-layer stacked film composed of the lower-surface oxidation preventing insulating film, the metal resistor element film and the upper-surface oxidation preventing insulating film.

\* \* \* \* \*